(12) United States Patent
Setthachayanon et al.

(10) Patent No.: US 7,736,818 B2
(45) Date of Patent: Jun. 15, 2010

(54) HOLOGRAPHIC RECORDING MEDIUM AND METHOD OF MAKING IT

(75) Inventors: Songvit Setthachayanon, Longmont, CO (US); Kuniaki Matsuda, Ohsaka (JP); Testuo Morimoto, Ibaraki (JP); Shin-Ichi Nakahara, Ibaraki (JP); Takeshi Someya, Ibaraki (JP)

(73) Assignees: Inphase Technologies, Inc., Longmont, CO (US); Hitachi Maxell, Ltd., Ibaragi (JP)

( * ) Notice: Subject to any disclaimer, the term of this patent is extended or adjusted under 35 U.S.C. 154(b) by 889 days.

(21) Appl. No.: 11/314,819

(22) Filed: Dec. 22, 2005

(65) Prior Publication Data
US 2006/0166104 A1 Jul. 27, 2006

Related U.S. Application Data

(60) Provisional application No. 60/638,373, filed on Dec. 27, 2004.

(51) Int. Cl.
*G03H 1/02* (2006.01)
(52) U.S. Cl. .................... 430/1; 430/2; 359/3
(58) Field of Classification Search ........ None
See application file for complete search history.

(56) References Cited

U.S. PATENT DOCUMENTS

| | | | |
|---|---|---|---|
| 4,683,195 A | 7/1987 | Mullis | |
| 4,683,202 A | 7/1987 | Mullis | |
| 4,800,159 A | 1/1989 | Mullis | |
| 5,405,766 A | 4/1995 | Kallury | |
| 5,603,872 A | 2/1997 | Margalit | |
| 5,610,287 A | 3/1997 | Nikiforov | |
| 5,621,210 A | 4/1997 | Lindsay | |
| 5,776,674 A | 7/1998 | Ulmer | |
| 5,840,862 A | 11/1998 | Bensimon et al. | |
| 5,887,135 A | 3/1999 | Dahlen | |
| 5,932,045 A * | 8/1999 | Campbell et al. | ........... 156/102 |
| 5,986,076 A | 11/1999 | Rothschild | |
| 6,013,454 A | 1/2000 | Tang | |
| 6,013,456 A | 1/2000 | Khavan-Tafti | |
| 6,054,327 A | 4/2000 | Bensimon et al. | |
| 6,054,495 A | 4/2000 | Markowitz | |

(Continued)

FOREIGN PATENT DOCUMENTS

EP   0-404-682 A   12/1990

(Continued)

OTHER PUBLICATIONS

Trentler et al. Epoxy resin—photopolymer composites for volume holography Chem. Mater. vol. 12 pp. 1431-1438 (2000).*
"Curing Agents for Epoxy Resin", Three Bond Technical news (pp. 1-10 (Dec. 1990).*
MIXPAC system 50, System information 50-1A (Jun. 2002) 4 pages.*
Smothers, W.K. et al. (1990), "Photopolymers for Holography," *SPIE OE/Laser Conference* 1212-03, Los Angeles.
W. Klien et al. (1967) "Unified Approach to Ultrasonic Light Diffraction," *IEE Transaction on Sonics and Ultrasonics* SU-14;123-134.

(Continued)

*Primary Examiner*—Martin J Angebrannt
(74) *Attorney, Agent, or Firm*—Morrison & Foerster LLP (57) ABSTRACT

A laminated holographic recording medium having (a) a first substrate having a through-hole and (b) a solid polymer matrix layer that records holographic data laminated to the first substrate and a method of manufacturing thereof are disclosed. The method of manufacturing preferably requires injecting a precursor material through the through-hole and polymerizing the precursor material in contact with the first substrate to form the polymer matrix layer.

16 Claims, 2 Drawing Sheets

U.S. PATENT DOCUMENTS

| | | | |
|---|---|---|---|
| 6,103,454 | A * | 8/2000 | Dhar et al. .................. 430/290 |
| 6,127,120 | A | 10/2000 | Graham et al. |
| 6,149,868 | A | 11/2000 | Natan et al. |
| 6,187,823 | B1 | 2/2001 | Haddon |
| 6,225,055 | B1 | 5/2001 | Bensimon et al. |
| 6,225,068 | B1 | 5/2001 | Wolfrum |
| 6,248,537 | B1 | 6/2001 | Bensimon |
| 6,258,401 | B1 | 7/2001 | Crowley |
| 6,265,153 | B1 | 7/2001 | Bensimon et al. |
| 6,283,812 | B1 | 9/2001 | Jin |
| 6,303,296 | B1 | 10/2001 | Bensimon et al. |
| 6,344,319 | B1 | 2/2002 | Bensimon et al. |
| 6,358,375 | B1 | 3/2002 | Schwob |
| 6,765,061 | B2 * | 7/2004 | Dhar et al. .................. 525/123 |
| 7,455,889 | B2 * | 11/2008 | Edwards et al. ............. 427/508 |
| 2002/0110740 | A1 * | 8/2002 | Otaki et al. .................... 430/1 |
| 2002/0145772 | A1 * | 10/2002 | Hegel ............................ 359/3 |
| 2003/0139486 | A1 * | 7/2003 | Yamada et al. ................ 522/71 |
| 2004/0002008 | A1 * | 1/2004 | Hegel et al. .................... 430/2 |
| 2004/0027625 | A1 * | 2/2004 | Trentler et al. ................. 359/3 |
| 2004/0036931 | A1 * | 2/2004 | Edwards ......................... 359/3 |
| 2004/0240010 | A1 * | 12/2004 | Takeyama .................... 359/15 |
| 2005/0196679 | A1 * | 9/2005 | Hayase et al. .................. 430/1 |
| 2006/0115740 | A1 * | 6/2006 | Hayase et al. .................. 430/1 |
| 2007/0166625 | A1 * | 7/2007 | Cole et al. ...................... 430/1 |

FOREIGN PATENT DOCUMENTS

| | | |
|---|---|---|
| EP | 0732-534 A | 9/1996 |
| JP | 05-212732 * | 8/1993 |
| WO | WO 01/61330 | 8/2001 |

OTHER PUBLICATIONS

Lougnot et al. (1993), *Pure and Appl. Optics* 2:383-372.
(1998,) *Applied Physics Letters* 73(10);1337-1339.
Kerker, M. (1969), *The Scattering of Light and Other Electromagnetic Radiation*: Academic Press, San Diego, CA, TOC only.
Brinke et al. (1994), "The Thermal Characterization of Multi-Component Systems by Enthalpy Relaxation," *Thermichmica Acta.* 238;75-98.
Olabisi et al. (1979), *Polymer-Polymer Miscibility* Academic Press, New York TOC only.
Robeson, L.M. (1982), *MMI Press Symp. Ser.* 2:177-211.
Utracki (1989), *Polymer Alloys and Blends: Thermodynamics and Rheology* Hanser Publishers, Munich Table of Contents only.
Krause (1989), *Polymer Handbook $3^{rd}$ Edition*, J. Brandrup and E.H. Immergut eds; Wiley Interscience, New York, NY. 347-370.
Zhou et al. (1983), *J. Polym. Sci. Polym. Phys. Ed.* 21(4):595-603.
Murali (1988), *J. Polym. Sci. Polym. Part B: Phys. Ed.* 28(7):1385-1396.
Natansohn et al. (1988), *Makromol. Chem. Macromol. Symp.* 16:175-183.
Taylor-Smith (1993), *Macromolecules* 26:2802-2809.
Piton et al. (1995), *Macromolecules* 28:1598-1604.
Piton et al. (1995), *Macromolecules* 28:1605-1609.
Hale et al. (1997) Ch. 4 "Polymer Blends and Block Copolymers," *Thermal Characterization of Polymeric Materials $2^{nd}$ Edition* pp. 745-887.
Robeson et al. (1991) Chemtracts-Macromol Chem. TOC only.
Vessely *Polymer Blends and Alloys* M.J. Folkes and P.S. Hope Eds. Blackler Academic and Professional, Glassoe 103-125.
Coleman et al. (1991), *Specific Interactions and the Miscibilty of Polymer Blends* Technomic Publishing, Lancaster, PA Table of Contents only.
Garton (1992), *Infrared Spectroscopy of Polymer Blends, Composites and Surfaces*, Hanser, New York, NY, Table of Contents only.
Kelts et al. (1993), *Macromolecules* 26:2941-2947.
White et al. (1994), *Macromolecules* 27:1648-1650.
Cruz et al. (1979), *Macromolecules* 12:726-731.
Landry et al. (1983) *Macromolecules* 26:35-46.

*Applied Physics Letters* 73(10):1337-1339 Dhar (Sep. 1998).
Grand et al. (1996), "Expitaxial Growth of Copper Phtalocyanin Monolayers on Ag(111)," *Surface Science* 366(3):403-414.
Berger & Kimmel, *Guide to Molecular Cloning Techniques* Academic Press, New York, NY, 1987.
Sambrook, et al, *Molecular Cloning: A Laboratory Manual $2^{nd}$ Ed.* Cold Spring Harbor Press, Cold Spring Harbor, NY, 1989.
*Protein Purification* (1987), Scopes ed.; Springer-Verlag, New York, NY.
*Methods in Molecular Biology; Protein Purification Protocols* vol. 59 (1996). Doonan ed.; Humana Press, Totowa, NJ.
Creighton (1984), *Proteins: Structures and Molecular Properties* Ch. 5.; W.H. Freeman ed.; New York, NY.
Ramachandran et al. (1968). *Adv. Protein Chem.* 23:283-437.
Lee and Meisel, (1982), "Adsorption and Surface-Enhanced raman of Dyes on Silver and Gold Coils," *J. Phys. Chem.* 86:3391-3395.
Feldheim, "Assembly of metal nanoparticle arrays using molecular bridges," The Electrochemical Society Interface, Fall, 2001, pp. 22-25.
Parker et al. (1991). "High Yield Synthesis, Separation, and Mass-Spectrometric Characterization of Fullerenes $C_{60}$ to $C_{266}$," *J.A. Chem. Soc.* 113:7499-7503.
Schoenfeld et al. (1995). Proc. $7^{th}$ $1^{st}$ int. Conf. on Modulated Semiconductor Structures, Madrid, 605-608.
Maivald et al. (1991), "Using Force Modulation to Image Surface Elasticities with the Atomic Force Microscope," *Nanotechnology* 2:103.
Chou & Fasman (1978). *Adv. Enzymol.* 47:45-148.
Bensimon, et al. (1995). "Stretching DNA with a Receding Meniscus: Experiments and Models," *Physical Review Letters* 74(23):4754-4757.
Michalet et al. (1997), "Dynamic Molecular Combing: Stretching the Whole Human Genome for High-Resolution Studies," *Science* 277:1518-1523.
Herrick et al. (2000), "Ouantifying Single Genre Copy Number by Measuring Fluorescent Probe Lengths on Combed Genomic DNA," *PNAS* 97(1):222-227.
Kotler et al. (1993), "DNA Sequencing: Modular Primers Assembled from a Library of Hexamers or Pentamers," *Proc, Natl. Acad. Sci.* 90:4241-4245.
Kaczorowski et al. (1996) "Co-Operativity of Hexamer Litigation," *Gene* 179:189-193.
Holmstrom et al, (1993), "A Highly Sensitive and Fast Nonradioactive Method for Detection of Polymerase Chain Reaction Products," *Anal. Biochem.* 209:278-283.
Running et al, (1990), "A Procedure for Productive Coupling of Synthetic Oligonucleotides to Polystyrene Microtiter Wells for Hybridization Capture," *BioTechniques* 8(3):276-277.
Newton et al, (1993), "The Production of PCR Products with 5' Single-Stranded Tails Using Primers That Incorporate Novel Phosphoramidite Intermediates," *Nucleic Acids Res.* 21(5):1155-1162.
Rasmussen et al. (1991), "Covalent Immobilization of DNA onto Polystyrene Microwells: The Molecules Are Only Bound at the 5' End," *Anal. Biochem.* 198:138-142.
Han et al. (2001), Quantun-Dot-Tagged Microbeads for Multiplexed Optical Coding of Biomolecules, *Nature Biotech.* 19:631-635.
Cunin et al. (2002), "Biomolecular Screening with Encoded Porous-Silicon Photonic Crystals," *Nature Materials* 1:39-41.
Hansma et al, (1996), "DNA Binding to Mica Correlates with Cationic Radius: Assay by Atomic Force Microscopy," *Biophys J.* 70:1933.
Lyubchenko et al. (1997), "Visualization of Supercoiled DNA with Atomic Force Microscopy in Situ," *PNAS* 94:496-501.
Kasas et al. (1997), "*Escherichia coli* RNA Polymerase Activity Observed Using Atomic Force Microscopy," *Biochemistry* 36:461.
Anderson et al. (2000), "Fabrication of Topologically Complex Three-Dimensional Microfludic Systems in PDMS by Rapid Prototyping," *Anal. Chem.* 72:3158-3164.

\* cited by examiner

HOLOGRAPHIC RECORDING MEDIUM AND METHOD OF MAKING IT

REFERENCE TO RELATED APPLICATION

This application claims priority to U.S. Provisional Application No. 60/638,373, filed Dec. 27, 2004, the contents of which are hereby incorporated by reference.

FIELD OF THE INVENTION

The invention relates to equipment for manufacturing mass storage holographic recording medium and a method for the same. In addition the invention relates to the precursors, particularly fast reaction precursor system adapted for reaction injection molding (RIM) type process for manufacturing mass storage holographic recording medium, and the medium made by the novel process of manufacturing mass storage holographic recording medium. The use of the instant method of manufacturing mass storage holographic medium and the precursors includes holographic optical data storage, optical lenses, beam steerers, and waveguides.

BACKGROUND

Developers of information storage devices and methods continue to seek increased storage capacity. As parts of this development, so-called page-wise memory systems, in particular holographic systems, have been suggested as alternatives to conventional memory devices.

In the typical holographic storage system, two coherent light beams are directed onto a storage medium. The first coherent light beam is a signal beam, which is used to encode data. The second coherent light beam is a reference light beam. The two coherent light beams intersect within the storage medium to produce an interference pattern. The storage medium records this interference pattern by changing its index of refraction to form an image of the interference pattern.

The recorded information, stored as a holographic image, can be read by illuminating the holographic image with a reference beam. When the holographic image is illuminated with a reference beam at an appropriate angle, a signal beam containing the information stored is produced. Most often the appropriate angle for illuminating the holographic image will be the same as the angle of the reference beam used for recording the holographic image. More than one holographic image may be stored in the same volume by, for example, varying the angle of the reference beam during recording.

The capabilities of holographic storage systems are limited in part by the storage media. Iron-doped lithium niobate has been used as a storage medium for research purposes for many years. However, lithium niobate is expensive, exhibits poor sensitivity (1 J/cm$^2$), has low index contrast ($\Delta$n of about 10$^{-4}$), and exhibits destructive read-out (i.e., images are destroyed upon reading). Alternatives have therefore been sought, particularly in the area of photosensitive polymer films. See, e.g., W. K. Smothers et al., "Photopolymers for Holography," SPIE OE/Laser Conference, 1212-03, Los Angeles, Calif., 1990. The material described in this article contains a precursor material containing a liquid monomer material (the photoactive monomer) and a photoinitiator (which promotes the polymerization of the monomer upon exposure to light), where the precursor material is in an organic polymer host matrix that is substantially inert to the exposure light. During writing of information into the material (by passing recording light through an array representing data), the monomer polymerizes in the exposed regions. Due to the lowering of the monomer concentration caused by the polymerization, monomer from the dark, unexposed regions of the material diffuses to the exposed regions. The polymerization and resulting concentration gradient create a refractive index change, forming the hologram representing the data. Unfortunately, deposition onto a substrate of the preformed matrix material containing the precursor material requires use of solvent, and the thickness of the material is therefore limited, e.g., to no more than about 150 µm, to allow enough evaporation of the solvent to attain a stable material and reduce void formation.

In holographic processes such as described above, which utilize three-dimensional space of a medium, the storage capacity is proportional to a medium's thickness. Thus, the need for solvent removal inhibits the storage capacity of a medium. (Holography of this type is typically referred to as volume holography because a Klein-Cook Q parameter greater than 1 is exhibited (see W. Klein and B. Cook, "Unified approach to ultrasonic light diffraction," *IEEE Transaction on Sonics and Ultrasonics,* SU-14, 1967, at 123-134). In volume holography, the media thickness is generally greater than the fringe spacing,)

U.S. Pat. No. 6,013,454 and application Ser. No. 08/698,142, the disclosures of which are hereby incorporated by reference, also relates to a precursor material in an organic polymer matrix. In particular, the application discloses a recording medium formed by polymerizing matrix material in situ from a fluid mixture of organic oligomer matrix precursor and a precursor material. A similar type of system, but which does not incorporate oligomers, is discussed in D. J. Lougnot et al., *Pure and Appl. Optics,* 2, 383 (1993). Because little or no solvent is typically required for deposition of these matrix materials, greater thicknesses are possible, e.g., 200 µm and above. However, while useful results are obtained by such processes, the possibility exists for reaction between the precursors to the matrix polymer and the photoactive monomer. Such reaction would reduce the refractive index contrast between the matrix and the polymerized photoactive monomer, thereby affecting to an extent the strength of the stored hologram.

Furthermore, the widespread use of holographic recording media has been limited due to low speed of manufacturing the media using conventional processes and conventional precursors. For example, as disclosed in JP-B No. 3330854, conventionally, a mixture of polymer precursor(s), solvent and photopolymerizing materials has been used as a precursor material for fabricating an organic hologram recording medium. Such a precursor material needs to be diluted with a solvent to be applied as a film/layer onto a substrate, leading to several problems such as void formation in the holographic recording medium due to evaporation of the solvent and a relatively long time to thicken the precursor material layer because such a process requires drying the solvent.

In the case of holographic recording media, since a signal recording density improves as the thickness of the recording material layer increases, an increase in recording material layer thickness is a very preferred factor. However, increasing the layer thickness causes concomitant problems stated above.

Another problem associated with convention processes for manufacturing holographic recording media is optical distortion of the holographic recording media. In particular, the processes for manufacturing holographic recording media that continuously mixes the precursor material constituents and applies the obtained mixture on the substrates using a mixer, is optical distortion of the holographic recording medium. The optical distortion is most likely to occur due to a difference in contraction with polymerization of the precursor material supplied from the mixer, resulting in adverse effects on the characteristics of the holographic recording media.

Moreover, many of conventional organic holographic recording media have a structure with the holographic recording material layer inserted between two substrates, a so-called sandwich structure. The sandwich structure is preferred because the holographic layer could be protected by the outer substrate layers. However, it is difficult to make the sandwich structure, particularly in a single manufacturing operation, by the conventional processes for manufacturing holographic recording medium using a system. In the case of the methods commonly used to apply a two-liquid mixing material, wherein a line of material is applied on the substrate by the mixer and another substrate is covered on the precursor material layer so that two substrates may sandwich the precursor material layer between themselves, adverse effects may be exerted on the shapes of light beams irradiated onto the media at hologram recording and/or reading out because the extent of material polymerization depends on the point at which the material is applied, leading to an unevenness in film thickness.

Thus, while progress has been made in fabricating photo-recording media suitable for use in holographic storage systems, further progress is desirable. In particular, the urgent need exists for a reliable, high speed process for manufacturing holographic recording media and for precursors adapted for such a process.

SUMMARY OF THE INVENTION

This invention describes novel process for manufacturing holographic recording media from novel photoactive precursors which provide exceptionally good uniformity in the quality of the holographic recording media resulting in high M/#, high sensitivity, and low optical distortion when of the holographic recording media.

One embodiment is a precursor material comprising (a) chemical constituents that react by a first reaction to form a solid polymer matrix in less than 20 minutes at room temperature or less than 15 minutes at 40° C. after mixing the chemical constituents at room temperature, and (b) a monomer and a photoinitiator, wherein the monomer and the photoinitiator react by a second reaction that is different from the first reaction. Preferably, the shrinkage of the precursor material during the formation of the solid polymer matrix is less than about 0.12%. Preferably, the monomer and the photoinitiator react by the second reaction to form a photopolymer. Preferably, the chemical constituents comprise an epoxy resin and an aliphatic amine. Preferably, the chemical constituents comprise an isocyanate and a polyol. Preferably, the monomer comprises an acrylate.

Another embodiment is a laminated holographic recording medium comprising (a) a first substrate having a through-hole and (b) a solid polymer matrix layer that records holographic data laminated to the first substrate, wherein the solid polymer matrix layer has a thickness in the range of about 300 micron to about 3,000 micron and is formed by polymerizing a precursor material that is injected through the through-hole and polymerized in contact with the first substrate. Preferably, the solid polymer matrix layer produces substantially no optical distortion. Preferably, the solid polymer matrix layer has a variation in the thickness of no more than 10 percent. Preferably, the first substrate is disk-shaped and the through-hole is at the center of the first substrate. Preferably, the solid polymer matrix layer is substantially void-free resulting in substantially no optical distortion in the solid polymer matrix layer. Preferably, the laminated holographic recording medium further comprises a second substrate. Preferably, the laminated holographic recording medium is disk-shaped or card-shaped, and the solid polymer matrix is located between the first and the second substrates.

Yet another embodiment is a method of manufacturing a laminated holographic recording medium comprising (a) a first substrate having a through-hole and (b) a solid polymer matrix layer that records holographic data laminated to the first substrate, the method comprising injecting a precursor material through the through-hole and polymerizing the precursor material in contact with the first substrate to form the polymer matrix layer. The method could further comprise mixing the precursor material in a mixer prior to the injecting the precursor material through the through-hole. The method could still further comprise applying pressure on the precursor material during the formation of the solid polymer matrix layer. The method could yet further comprise holding the first substrate and a second substrate on rigid bases to form a clearance between the first and second substrates. The method could further comprise decreasing the clearance during polymerization of the precursor material.

DETAILED DESCRIPTION

The following includes definitions of selected terms used throughout the disclosure. The definitions include examples of various embodiments and/or forms of components that fall within the scope of a term and that may be used for implementation. Of course, the examples are not intended to be limiting and other embodiments may be implemented. Both singular and plural forms of all terms fall within each meaning:

Monomer—refers to molecules capable of polymerization via free radical, cationic, and/or anionic mechanisms. In general, the term may refer to a mixture of different monomers. The monomers may be monofunctional, difunctional, or polyfunctional (in regards to the functionality capable of polymerization). Vinyl monomers and epoxides are two example classes of polymerizable molecules. Polymerizable oligomers are considered to be large monomers. Polymerizable dendrimers are also considered as monomers.

Matrix—refers to the polymeric material (organic and/or inorganic) that is used to give desired physical properties to a given media prior to recording of spatial light intensity patterns. Thermoplastic and thermoset materials are considered. For mesophasic materials, each phase can be a completely separate chemical composition. The term "matrix" refers to all polymeric material and other constituents in a media formulation regardless of type and number of different phases present that contribute to the formation of the mesophasic material. For instance, in a two phase system, one phase of the media may be a thermoset while the other phase may be a thermoplastic or even a liquid, together both are referred to as the matrix. Thermoset matrix formation may occur before, after, or during mesophase formation. Formation of a thermoset matrix can occur through any mechanism known to form such materials (chain, step growth, or other mechanisms). The matrix may contain polymerizable functionalities (compatible with polymerization with monomer) and/or attachment sites and/or detachment sites for photoreactions.

Photoinitiator—For the purpose of the present invention, the term "photoinitiator" refers to the conventional meaning of the term photoinitiator and also refers to sensitizers and dyes. In general, a photoinitiator causes the polymerization of a material, such as a monomer, when the material containing the photoinitiator is exposed to light of a wavelength that activates the photoinitiator. The photoinitiator may refer to a combination of components, some of which individually are not light sensitive, yet in combination are capable of curing the polymerizable monomer; examples are dye/amine, sensitizer/iodonium salt, dye/borate salt, etc.

Photopolymer—polymer formed from a photoreaction, typically a chain reaction mechanism. Typically, photopolymer formation is caused by photoinitiators or photocatalyst being exposed to irradiation to which they are sensitive.

Photosensitive material—Any material containing components that are light sensitive; where upon irradiation with light, record the spatial light intensity as a chemical change in the media. The chemical change is typically a refractive index change, but can be a photochromic change.

Photosensitive component—refers to the chemicals or combination of chemicals responsible for recording spatial light intensity. As such, some example photosensitive components are photoinitiators, photoinitiators in combination with polymerizable monomers, photorefractive, photochromic and photodimerizable molecules. Some photosensitive components may be capable of reversible reactions, thus allowing for erasing of a recorded spatial light intensity pattern.

The M/# is defined to be the dynamic range of the recording material. The M/# is measured by multiplexing a series of holograms with exposure times set to consume all of the photoactive materials in the media. The M/# is then the sum of the square roots of the diffraction efficiencies of all of the multiplexed holograms. The M/# depends on the thickness of the media.

The sensitivity is measured by the cumulative exposure time required to reach 80% of the total M/# of the recording medium. The higher the sensitivity of the material, the shorter the cumulative exposure time required to reach 80% of the total M/#.

The shrinkage (occurring primarily in the thickness of the medium) is determined by measuring the Bragg detuning (the shift in the readout angle) of the angle multiplexed holograms. The quantitative relationship between the physical shrinkage of the material and the Bragg detuning is described in detail in the above reference, i.e., Applied Physics Letters, Volume 73, Number 10, p. 1337-1339, 7 Sep. 1998.

The inhibition time is defined as the time it takes for the holograms to form from the time the media is exposed to a light source.

The optical article, e.g., holographic data recording medium, of the invention is formed by steps including mixing a matrix precursor and a photoactive monomer of a precursor material, and curing the precursor material to form the matrix in situ. The matrix precursor and photoactive monomer are selected such that the following conditions are preferentially met by such the precursor material. (1) The precursor material is a "two-chemistry system" such that the reaction by which the matrix precursor is polymerized during the cure is independent from the reaction by which the photoactive monomer will be polymerized during writing of a pattern, e.g., data. (2) The matrix polymer and the polymer resulting from polymerization of the photoactive monomer (the photopolymer) are compatible with each other. As discussed previously, the matrix is considered to be formed when the photorecording material, i.e., the matrix material plus the photoactive monomer, photoinitiator, and/or other additives, exhibits an elastic modulus of at least about $10^5$ Pa, generally about $10^5$ Pa to about $10^9$ Pa, advantageously about $10^6$ Pa to about $10^8$ Pa.

The compatibility of the matrix polymer and photopolymer tends to prevent large-scale (>100 nm) phase separation of the components, such large-scale phase separation typically leading to undesirable haziness or opacity. Utilization of a photoactive monomer and a matrix precursor that polymerize by independent reactions provides a cured matrix substantially free of cross-reaction, i.e., the photoactive monomer remains substantially inert during the matrix cure. In addition, due to the independent reactions, there is no inhibition of subsequent polymerization of the photoactive monomer. At least one photoactive monomer contains one or more moieties, excluding the monomer functional groups, that are substantially absent from the polymer matrix, i.e., it is possible to find a moiety in the photoactive monomer such that no more than 20% of all such moieties in the photorecording material are present, i.e., covalently bonded, in the matrix. The resulting optical article is capable of exhibiting desirable refractive index contrast due to the independence of the matrix from the photoactive monomer.

This invention relates to a so-called two-liquid solidifying process, the equipment and precursor material for such a process, wherein the precursor material is polymerized into a solidified material through a chemical reaction initiated by mixing a plurality of liquid constituents. By the process and system of this invention, it is easy to thicken the precursor material layer and form a sandwich structure because the need for a drying step is eliminated. However, the use of this so-called two-liquid solidifying material induces a contraction in volume due to polymerization involved with the chemical reaction initiated immediately after the constituent materials are mixed, which could cause a problem of an optical distortion. The process of this invention minimizes such contraction induced optical distortion.

To attain the above-mentioned embodiment, the method of the present invention is characterized in that any optical distortion and local contraction caused due to a difference in extent of reaction can be prevented from occurring during the injection of the precursor material by pre-forming a through-hole on a first plane substrate, placing the first plane substrate opposed to a second plane substrate at a given distance, and then sequentially applying the precursor material mixed by any of mixing means, such as a dynamic mixer, through the through-hole formed on the first plane substrate.

The method of the present invention, in which the first and second plane substrates have been previously placed opposed to one another at a given distance and the mixed precursor material is injected through the through-hole formed on the first plane substrate to cause a reaction, minimizes possible mixture of the recording layer constituent materials with vastly different extents of reaction during injection, effectively preventing any optical distortion from occurring.

Moreover, the method of the present invention involves a step for spreading a homogeneously mixed precursor material with the same extent of reaction concentrically around the through-hole, minimizing any local variance in thickness of the surface layer of the deposited recording medium involved with contraction, which could have adverse effects on the shapes of light beams irradiated to the recording material layer at holographic recording and/or reading out.

In particular, these effects are outstanding in the disk-shaped holographic recording media. In the case of these media, which have the through-hole formed at the center of the disk-shaped substrate, when the precursor material is injected, the front of the liquid material spreads concentrically and material supply can be stopped just at the outer edge of the disk. This means that the need for a step for processing the outer edges, which may cause a problem involved in manufacturing disks, is eliminated, allowing the disk manufacturers to enjoy the advantage in manufacturing disks.

The method of the present invention gradually polymerizes the recording layer material injected between the first and second substrates and contracts its volume in stages. This means that it is preferred to provide manufacturing equipment with a mechanism for coping with this volume contraction. To successfully do so, it is useful to gradually narrow the clearance between the first and second substrates as the material volume contracts.

The extent of narrowing the clearance during reaction depends on the contraction coefficient for polymerization in fabricating the material to be used. Note that assuming that the volume contraction coefficient of the precursor material in fabricating the material is X, it is preferable to set the amount to be narrowed, $\Delta t$ to any of a range from 0.5 Xt to 0.9 Xt and if the clearance is narrowed along with the volume contraction coefficient, an optical distortion may be brought by contrast.

Moreover, the method of the present invention fills the precursor material into the clearance previously formed between the first and second substrates through the through-hole, the target thickness of the precursor material layer to be deposited being limited.

Preferably, this thickness is more than or equal to 300 μm and less than or equal to 3000 μm, more preferably 500 μm and less than or equal to 2500 μm, and most preferably 750 μm and less than or equal to 2000 μm. If it is less than 300 μm, an unevenness could occur in the precursor material-filled layer due to a variation in the clearance between the first and second substrates involved with different substrate thicknesses or unstably-held substrates, while if it is more than or equal to 3000 μm, the precursor material is irregularly discharged, leading to a difficulty in its concentric application.

Figure 1:
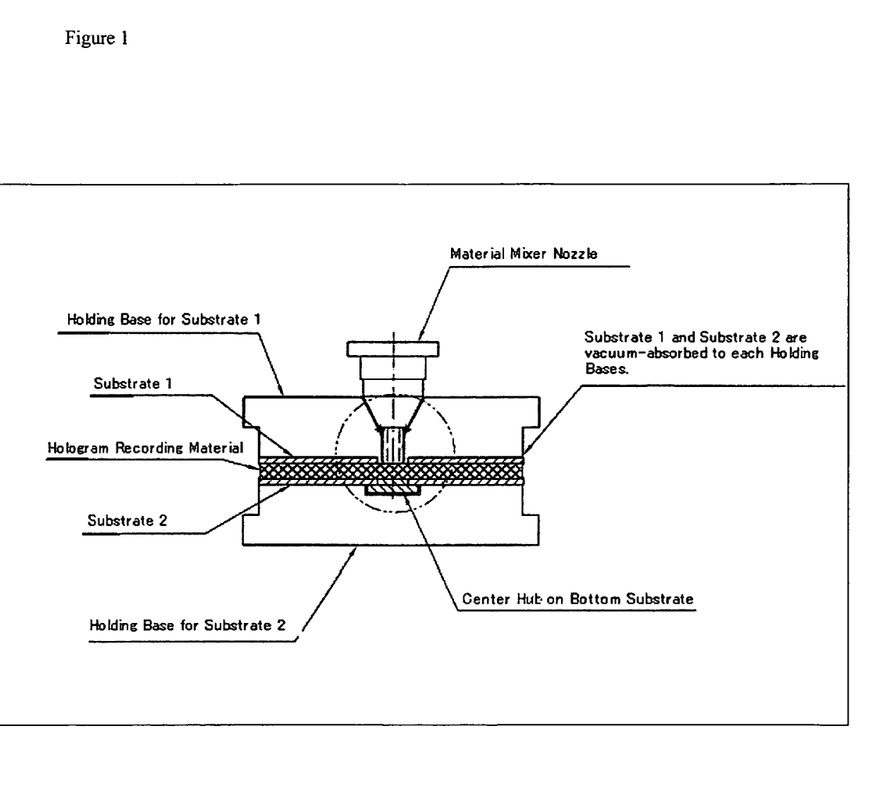
FIG. 1 is a schematic view showing the structure of an embodiment of the injection molding-type apparatus ("the bonding unit") for forming a laminated holographic recording media.
Figure 2:
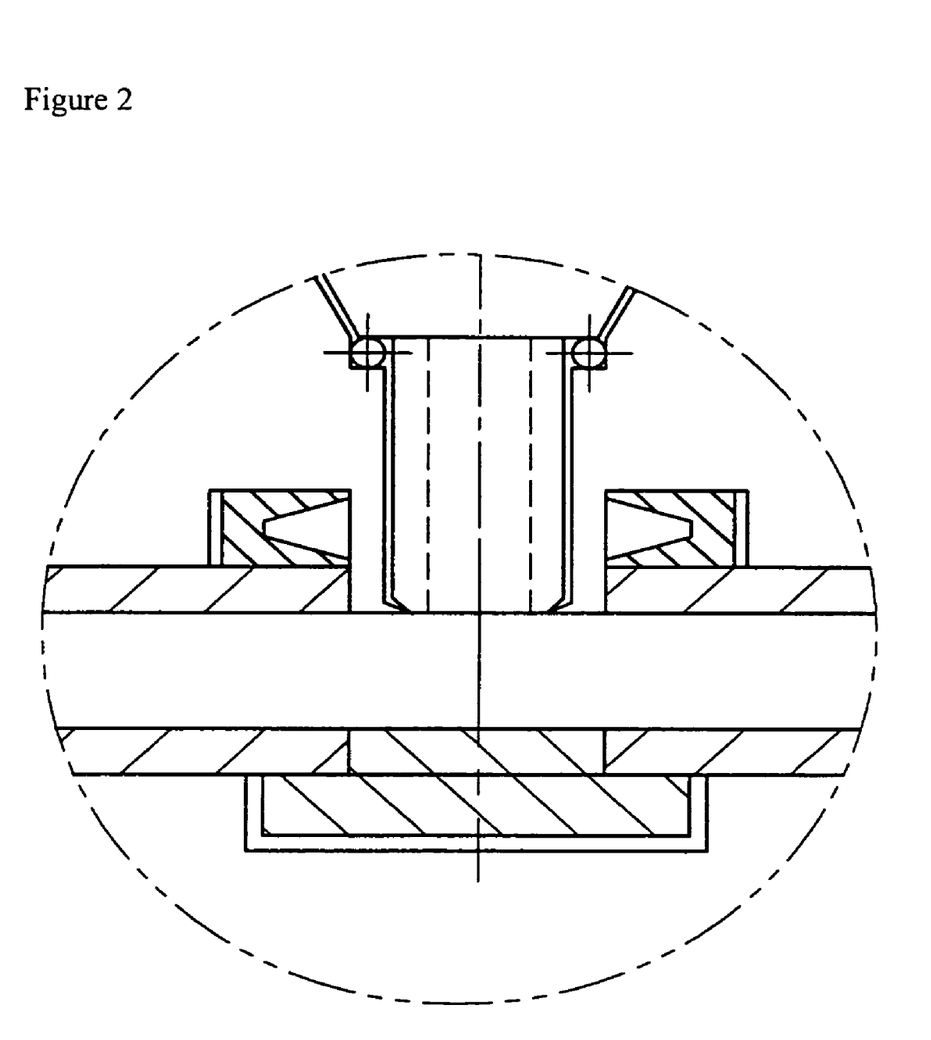
FIG. 2 is a cross sectional view showing an embodiment of the bonding unit according to the present invention.

FIG. 1 is a schematic view showing the structure of an embodiment of the injection molding-type apparatus ("the bonding unit") for forming a laminated holographic recording media As shown in FIG. 1, the bonding unit is composed of a holding base for a first holographic recording medium substrate (hereafter, simply referred to as substrate 1) with a through-hole formed on it, a holding base for a second holographic recording medium substrate (hereafter, simply referred to as substrate 2) being placed opposed to the substrate 1, and a dynamic mixer for supplying a mixed precursor material.

A through-hole has been formed on the holding base for the substrate 1, through which the holographic material mixer and the substrate 1 with the through-hole formed on it can be connected.

Furthermore, a force for offsetting the weight of the base has been previously applied by means of a spring so that the holding base for the substrate 2 capable of moving upward while maintaining its parallelism may move upward through polymerization and contraction of the precursor material in fabricating the medium.

In manufacturing the holographic recording medium, the substrate 1 with the through-hole formed at its center is vacuum-absorbed to the holding base for the substrate 1. Then, the substrate 2 is vacuum-absorbed to the opposite holding base.

Preferably, the substrate 2 has no through-hole formed on it. However, if the substrate 2 has a through-hole formed on it in the same manner as that of the substrate 1, it is preferable that the through-hole be previously closed by means of a seal or stopper. Note that care should preferably be taken not to create a steep difference in height or a gap on a boundary between the area where the seal or stopper is put and the area where the precursor material is deposited, preventing bubbles from mixing into the injected precursor material.

In one embodiment, the sequence of steps in the method for manufacturing holographic recording media is described below. A dynamic mixer, which is used for mixing the two components of the precursor material, is inserted into the substrate 1 through a through-hole formed at the center of the holding base. The precursor material is filled into a clearance between the first and second substrates. The precursor material within the clearance is polymerized, while optionally, simultaneously the clearance is decreased to compensate for any contraction of the precursor material during polymerization.

The precursor material could be any of material system(s) containing a material which initiates reaction when mixed another chemical component and/or a material which reacts to a light beam irradiated.

In one embodiment, the precursor materials of the two component system of the present invention, for example, could be the following materials:

Liquid A: Mixture of epoxy based on bis-phenol A and glycidyl acrylate.

Liquid B: Mixture of aliphatic amine, bromophenyl acrylate and photopolymerization initiator.

In the case of the above-mentioned precursor material system, when liquids A and B are mixed, the constituents epoxy based on bis-phenol A and glycidyl acrylate of liquid A, and the constituent aliphatic amine of liquid B react among each other at room temperature, losing its fluidity and then bromophenyl acrylate is photopolymerized, allowing for holographic data recording.

On the other hand, the method of the present invention does not limit the precursor material system to those described herein and other precursor materials may be used including those which are composed of more than one component and have such a characteristic that they lose fluidity through chemical reaction initiated when being mixed even though they could have been in the liquid phase immediately after being mixed. Such a non-fluid precursor material could then be formed into a holographic recording media by photopolymerization in the non-fluid precursor material shaped in the desired shape even though the precursor material has substantially no fluidity.

For the holographic recording medium, any bubble in the precursor material deforms the front of the liquid precursor material. Subsequently, when the bubble is trapped in the solidified holographic recording medium to create a permanently deformed front, the bubble disturbs the holographic recording by the light beam coming through the deformed front. To avoid this problem, the precursor material should preferably be injected with enough care. It is preferred to take appropriate actions such as depressurization at necessary points or control of the flow rate of the front of the precursor material to prevent bubbles from mixing into the precursor material.

In particular, after injection of the precursor material into the clearance, bubbles are most likely to be created when the liquid precursor material comes in contact with the substrate 2. Thus, it is useful to take actions such as depressurization, reduction of the distance between the mixer tip and the substrate, and reduction of the material applying rate.

Once the recording material is injected up to the given area, the mixer is removed from a mold, and the material is kept as it is until its fluidity decreases as the viscosity of the precursor material increases by the polymerization reaction in the precursor material. Alternatively, a nozzle and the mixer may be removed with the nozzle attached to the mixer.

During the polymerization reaction, the volume of the precursor material contracts gradually along with the extent of polymerization and the holding base for the substrate 2 moves upward under externally applied force, reducing the internal clearance containing the precursor material undergoing contraction under pressure.

Although this reduction effect is useful up to the point where the precursor material is gelled when its fluidity is lost, further reduction may bring a distortion, which is caused by the pressure applied, within the recording material layer. Accordingly, care should preferably be taken to prevent excessive pressure on the precursor material during the contraction of the precursor material. The clearance between the holding bases should preferably be controlled by any mechanical means such as a motor in conjunction with a clearance measurement device.

At the point where the reaction progresses and the precursor material solidifies, the object combining substrates 1 and 2 with the solidified product of the precursor material is removed from the mold for the use as a disk, for example. Note that the disk, after being removed, may be heated or irradiated for further polymerization reaction.

In one embodiment of the invention, the reaction progresses at room temperature. Alternatively, the reaction rate may be improved using the heating process by integrating a heater in the holding base, putting the unit in an oven or irradiating the solidified product of the precursor material.

In connection with the above-mentioned embodiment, an example where two substrates are bonded together with a holographic recording medium therein has been described. However, this invention is not limited to this example and may be applicable to the cases were there are none or any number of substrates in conjunction with one or more layers of a holographic recording media.

Moreover, the recording medium is not limited to the disk-shaped ones and may be used, for example, in the form of card or a currency note. In short, the present invention can provide the method for manufacturing the recording medium which is capable of preventing a deterioration in characteristics involved with an unevenness in the precursor material layer when the two-liquid solidifying precursor material is filled into a clearance between two substrates held in parallel with one another through a through-hole formed on one of the substrate.

The formation of a hologram, waveguide, or other optical article relies on a refractive index contrast (Δn) between exposed and unexposed regions of a medium, this contrast at least partly due to monomer diffusion to exposed regions. High index contrast is desired because it provides improved signal strength when reading a hologram, and provides efficient confinement of an optical wave in a waveguide. One way to provide high index contrast in the invention is to use a photoactive monomer having moieties (referred to as index-contrasting moieties) that are substantially absent from the matrix, and that exhibit a refractive index substantially different from the index exhibited by the bulk of the matrix. For example, high contrast would be obtained by using a matrix that contains primarily aliphatic or saturated alicyclic moieties with a low concentration of heavy atoms and conjugated double bonds (providing low index) and a photoactive monomer made up primarily of aromatic or similar high-index moieties.

The matrix is a solid polymer formed in situ from a matrix precursor by a curing step (curing indicating a step of inducing reaction of the precursor to form the polymeric matrix). It is possible for the precursor to be one or more monomers, one or more oligomers, or a mixture of monomer and oligomer. In addition, it is possible for the precursor to be greater than one type of precursor functional groups, either on a single precursor molecule or in a group of precursor molecules. (Precursor functional groups are the group or groups on a precursor molecule that are the reaction sites for polymerization during matrix cure.) To promote mixing with the photoactive monomer, the precursor is advantageously liquid at some temperature between about −50° C. and about 80° C. Advantageously, the matrix polymerization is capable of being performed at room temperature. Also advantageously, the polymerization is capable of being performed in a time period less than 5 minutes. The glass transition temperature ($T_g$) of the photorecording material is advantageously low enough to permit sufficient diffusion and chemical reaction of the photoactive monomer during a holographic recording process. Generally, the $T_g$ is not more than 50° C. above the temperature at which holographic recording is performed, which, for typical holographic recording, means a $T_g$ between about 80° C. and about −130° C. (as measured by conventional methods).

Examples of polymerization reactions contemplated for forming matrix polymers in the invention include isocyanate-hydroxyl step polymerization (urethane formation), isocyanate-amine step polymerization (urea formation), cationic epoxy polymerization, cationic vinyl ether polymerization, cationic alkenyl ether polymerization, cationic allene ether polymerization, cationic ketene acetal polymerization, epoxy-amine step polymerization, epoxy-mercaptan step polymerization, unsaturated ester-amine step polymerization (via Michael addition), unsaturated ester-mercaptan step polymerization (via Michael addition), and vinyl-silicon hydride step polymerization (hydrosilylation).

Several such reactions are enabled or accelerated by suitable catalysts. For example, cationic epoxy polymerization takes place rapidly at room temperature by use of $BF_3$-based catalysts, other cationic polymerizations proceed in the presence of protons, epoxy-mercaptan reactions and Michael additions are accelerated by bases such as amines, hydrosilylation proceeds rapidly in the presence of transition metal catalysts such as platinum, and urethane and urea formation proceed rapidly when tin catalysts are employed. It is also possible to use photogenerated catalysts for matrix formation, provided that steps are taken to prevent polymerization of the photoactive monomer during the photogeneration.

The photoactive monomer is any monomer or monomers capable of undergoing photoinitiated polymerization, and which, in combination with a matrix material, meets the polymerization reaction and compatibility requirements of the invention. Suitable photoactive monomers include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. Free-radical copolymerizable pair systems such as vinyl ether mixed with maleate and thiol mixed with olefin are also suitable. It is also possible to use cationically polymerizable systems such as vinyl ethers, alkenyl ethers, allene ethers, ketene acetals, and epoxies. It is also possible for a single photoactive monomer molecule to contain more than one monomer functional group. These monomers could be used as by themselves or in combination in a mixture.

As mentioned previously, relatively high index contrast is desired in the article of the invention, whether for improved readout in a recording media or efficient light confinement in a waveguide. In addition, it is advantageous to induce this relatively large index change with a small number of monomer functional groups, because polymerization of the monomer generally induces shrinkage in a material.

Such shrinkage has a detrimental effect on the retrieval of data from stored holograms, and also degrades the performance of waveguide devices such as by increased transmission losses or other performance deviations. Lowering the number of monomer functional groups that should preferably be polymerized to attain the necessary index contrast is therefore desirable. This lowering is possible by increasing the ratio of the molecular volume of the monomers to the number of monomer functional groups on the monomers. This increase is attainable-by incorporating into a monomer larger index-contrasting moieties and/or a larger number of index-contrasting moieties. For example, if the matrix is composed primarily of aliphatic or other low index moieties and the monomer is a higher index species where the higher index is imparted by a benzene ring, the molecular volume could be increased relative to the number of monomer functional groups by incorporating a naphthalene ring instead of a benzene ring (the naphthalene having a larger volume), or by incorporating one or more additional benzene rings, without increasing the number of monomer functional groups. In this manner, polymerization of a given volume fraction of the monomers with the larger molecular volume/monomer functional group ratio would require polymerization of less monomer functional groups, thereby inducing less shrinkage. But the requisite volume fraction of monomer would still diffuse from the unexposed region to the exposed region, providing the desired refractive index.

Numerous architectures are possible for monomers containing multiple index-contrasting moieties. For example, it is possible for the moieties to be in the main chain of a linear oligomer, or to be substituents along an oligomer chain. Alternatively, it is possible for the index-contrasting moieties to be the subunits of a branched or dendritic low molecular weight polymer. The preferred photoactive monomers are disclosed above.

Typically, 0.1 to 20 wt. % photoactive monomer, based on the weight of the precursor material, provides desirable results. The preferred acrylate monomers are monofunctional. These include 2,4,6-tribromophenylacrylate; 2,4-bis (2-naphthylthio)-2-butylacrylate; pentabromoacrylate; isobornylacrylate; phenylthioethyl acrylate; tetrahydrofurfurylacrylate; 1-vinyl-2-pyrrolidinone; 2-phenoxyethylacrylate; and the like.

In addition to the photoactive monomer, the optical article could contain a photoinitiator (the photoinitiator and photoactive monomer being part of the overall precursor material). The photoinitiator, upon exposure to relatively low levels of the recording light, chemically initiates the polymerization of the monomer, avoiding the need for direct light-induced polymerization of the monomer. The photoinitiator generally should offer a source of species that initiate polymerization of the particular photoactive monomer. About 0.1 to 20 wt. % photoinitiator, based on the weight of the precursor material, provides desirable results.

A variety of photoinitiators known to those skilled in the art and available commercially are suitable for use in the invention. It is advantageous to use a photoinitiator that is sensitive to light in the visible part of the spectrum, particularly at wavelengths available from conventional laser sources, e.g., the blue and green lines of Ar+ (458, 488, 514 nm) and He—Cd lasers (442 nm), the green line of frequency doubled YAG lasers (532 nm), and the red lines of He—Ne (633 nm) and Kr+ lasers (647 and 676 nm). One advantageous free radical photoinitiator is bis($\eta$-5-2,4-cyclopentadien-1-yl)bis [2,6-difluoro-3-(1H-pyrrol-1-yl)phenyl]titanium, available commercially from Ciba as Irgacure-784. Another visible free-radical photoinitiator (which requires a co-initiator) is 5,7,diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. In the case of cationically polymerizable monomers, a cationic photoinitiator is used, such as a sulfonium salt or an iodonium salt. These cationic photoinitiator salts absorb predominantly in the UV portion of the spectrum, and are therefore typically sensitized with a dye to allow use of the visible portion of the spectrum. An example of an alternative visible cationic photoinitiator is ($\eta_5$-2,4-cyclopentadien-1-yl)($\eta_6$-isopropylbenzene)-iron(II)hexafluorophosphate, available commercial from Ciba as Irgacure 261. It is also conceivable to use other additives in the precursor material, e.g., inert diffusing agents having relatively high or low refractive indices.

Preferably, the photoinitiators are selected according to their sensitivity to the light sources. For example, Irgacure 369, Irgacure 819, and Irgacure 907 are suitable for commercial blue laser systems. Irgacure-784 is suitable for green laser systems, and CB-650 is suitable for red laser systems. Irgacure products are available from Ciba; CB-650 is available from the Spectra Group.

Advantageously, for holographic recording, the matrix is a polymer formed by isocyanate-hydroxyl step polymerization, more advantageously a polymer formed by isocyanate-hydroxyl step polymerization having a polyether backbone. The polyether backbone offers desirable compatibility with several useful photoactive monomers, particularly vinyl aromatic compounds. Specifically, photoactive monomers selected from styrene, bromostyrene, divinyl benzene, and 4-methylthio-1-vinylnaphthalene (MTVN) have been found to be useful with matrix polymers formed by isocyanate-hydroxyl step polymerization and having a polyether backbone. A monomer that has more than one index-contrasting moiety and that is also useful with these polyether matrix polymers is 1-(3-(naphth-1-ylthio)propylthio)-4-vinylnaphthalene. Other more preferred monomers include 2,4-bis(2-naphthylthio)-2-butylacrylate, and tribromophenyl acrylate.

To be independent, the polymerization reactions for the matrix precursor and the photoactive monomer are selected such that: (a) the reactions proceed by different types of reaction intermediates, (b) neither the intermediate nor the conditions by which the precursor material is polymerized will induce substantial polymerization of the photoactive monomer functional groups, and (c) neither the intermediate nor the conditions by which the precursor material is polymerized will induce a non-polymerization reaction of the monomer functional groups that causes cross-reaction (between the monomer functional groups and the matrix polymer) or inhibits later polymerization of the monomer functional groups. According to item (a), if a precursor material is polymerized by use of an ionic intermediate, it would be suitable to polymerize the photoactive monomer by use of a free radical reaction. In accordance with item (b), however, the ionic intermediate should not induce substantial polymerization of the photoactive monomer functional groups. Also in accordance with item (b), for example, one should preferably be aware that a photoinitiated free radical precursor material polymerization will typically induce a photoinitiated cationic polymerization of a photoactive monomer functional group. Thus, two otherwise independent reactions are not independent for purposes of the invention if both are driven by a single reaction condition. In accordance with item (c), for example, base-catalyzed precursor material polymerization should not be performed when the photoactive monomer functional group undergoes a non-polymerization reaction in response to the base, even if polymerization of the monomer functional group is performed by an independent reaction. A specific example is that a base-catalyzed epoxy-mercaptan polymerization should not be used with an acrylate monomer because, although the acrylate is polymerized by a free radical reaction, the acrylate will react with the mercaptans under base catalysis, resulting in a cross-reaction.

Table 1 below illustrates some examples of precursor materials including a photoactive monomer where the precursor material polymerization reaction and photoactive monomer polymerization are capable of being independent, and examples where the polymerizations interfere with each other. (Photoactive monomers are horizontal, and the precursor materials are vertical. "X" indicates cross-reaction or monomer polymerization during precursor material polymerization. "O" indicates independent reactions. "I" indicates that the photoactive monomer polymerization is inhibited by the reagents or reaction that forms the polymeric matrix, e.g., the photoactive monomer functional group is converted to a non-polymerizing group, or chemical species are present after the precursor material cures that substantially slow the rate or yield of polymerization of the monomer functional groups.)

TABLE 1

| | (Meth) acrylates | Styrene Derivatives | Vinyl Ethers | Epoxies |
|---|---|---|---|---|
| Cationic Epoxy | O | O | X | X |
| Cationic Vinyl Ethers | O | O | X | X |
| Epoxy (amine) | X | O | I | X |
| Epoxy (mercaptan) | X | O | I | X |
| Unsaturated ester (amine) | X | O | I | X |
| Unsaturated ester (mercaptan) | X | O | I | X |
| Hydrosilylation | X | X | X | O |
| Urethane formation | O | O | O | X |

For purposes of the invention, polymers are considered to be compatible if a blend of the polymers is characterized, in 90° light scattering, by a Rayleigh ratio ($R_{90°}$) less than $7 \times 10^{-3}$ cm$^{-1}$. The Rayleigh ratio, $R_\theta$, is a conventionally known property, and is defined as the energy scattered by a unit volume in the direction $\theta$, per steradian, when a medium is illuminated with a unit intensity of unpolarized light, as discussed in M. Kerker, *The Scattering of Light and Other Electromagnetic Radiation*, Academic Press, San Diego, 1969. The light source used for the measurement is generally a laser having a wavelength in the visible part of the spectrum. Normally, the wavelength intended for use in writing holograms is used. The scattering measurements are made upon a photorecording material that has been flood exposed. The scattered light is collected at an angle of 90° from the incident light, typically by a photodetector. It is possible to place a narrowband filter, centered at the laser wavelength, in front of such a photodetector to block fluorescent light, although such a step is not required. The Rayleigh ratio is typically obtained by comparison to the energy scatter of a reference material having a known Rayleigh ratio.

Polymer blends, which are considered to be miscible, e.g., according to conventional tests such as exhibition of a single glass transition temperature, will typically be compatible as well, i.e., miscibility is a subset of compatibility. Standard miscibility guidelines and tables are therefore useful in selecting a compatible blend. However, it is possible for polymer blends that are immiscible to be compatible according to the light scattering test above.

A polymer blend is generally considered to be miscible if the blend exhibits a single glass transition temperature, $T_g$, as measured by conventional methods. An immiscible blend will typically exhibit two glass transition temperatures corresponding to the $T_g$ values of the individual polymers. $T_g$ testing is most commonly performed by differential scanning calorimetry (DSC), which shows the $T_g$ as a step change in the heat flow (typically the ordinate). The reported $T_g$ is typically the temperature at which the ordinate reaches the mid-point between extrapolated baselines before and after the transition. It is also possible to use Dynamic Mechanical Analysis (DMA) to measure $T_g$. DMA measures the storage modulus of a material, which drops several orders of magnitude in the glass transition region. It is possible in certain cases for the polymers of a blend to have individual $T_g$ values that are close to each other. In such cases, conventional methods for resolving such overlapping $T_g$ should be used, such as discussed in Brinke et al., "The thermal characterization of multi-component systems by enthalpy relaxation," *Thermochimica Acta.*, 238 (1994), at 75.

Matrix polymer and photopolymer that exhibit miscibility are capable of being selected in several ways. For example, several published compilations of miscible polymers are available, such as O. Olabisi et al, *Polymer-Polymer Miscibility*, Academic Press, New York, 1979; L. M. Robeson, *MMI, Press Symp. Ser.*, 2, 177, 1982; L. A. Utracki, *Polymer Alloys and Blends: Thermodynamics and Rheology*, Hanser Publishers, Munich, 1989; and S. Krause in *Polymer Handbook*, J. Brandrup and E. H. Immergut, Eds., 3rd Ed., Wiley Interscience, New York, 1989, pp. VI 347-370, the disclosures of which are hereby incorporated by reference. Even if a particular polymer of interest is not found in such references, the approach specified allows determination of a compatible photorecording material by employing a control sample.

Determination of miscible or compatible blends is further aided by intermolecular interaction considerations that typically drive miscibility. For example, it is well known that polystyrene and poly(methylvinylether) are miscible because of an attractive interaction between the methyl ether group and the phenyl ring. It is therefore possible to promote miscibility, or at least compatibility, of two polymers by using a methyl ether group in one polymer and a phenyl group in the other polymer. It has also been demonstrated that immiscible polymers are capable of being made miscible by the incorporation of appropriate functional groups that can provide ionic interactions. (See Z. L. Zhou and A. Eisenberg, *J. Polym. Sci., Polym. Phys. Ed.*, 21 (4), 595, 1983; R. Murali and A. Eisenberg, *J. Polym. Sci., Part B: Polym. Phys.*, 26 (7), 1385, 1988; and A Natansohn et al., *Makromol. Chem., Macromol. Symp.*, 16, 175, 1988). For example polyisoprene and polystyrene are immiscible. However, when polyisoprene is partially sulfonated (5%), and 4-vinyl pyridine is copolymerized with the polystyrene, the blend of these two functionalized polymers is miscible. It is contemplated that the ionic interaction between the sulfonated groups and the pyridine group (proton transfer) is the driving force that makes this blend miscible. Similarly, polystyrene and poly(ethyl acrylate), which are normally immiscible, have been made miscible by lightly sulfonating the polystyrene. (See R. E. Taylor-Smith and R. A. Register, *Macromolecules*, 26, 2802, 1993.) Charge-transfer has also been used to make miscible polymers that are otherwise immiscible. For example it has been demonstrated that, although poly(methyl acrylate) and poly(methyl methacrylate) are immiscible, blends in which the former is copolymerized with (N-ethylcarbazol-3-yl)methyl acrylate (electron donor) and the latter is copolymerized with 2-[(3,5-dinitrobenzoyl)oxy]ethyl methacrylate (electron acceptor) are miscible, provided the right amounts of donor and acceptor are used. (See M. C. Piton and A. Natansohn, *Macromolecules*, 28, 15, 1995.) Poly(methyl methacrylate) and polystyrene are also capable of being made miscible using the corresponding donor-acceptor co-monomers (See M. C. Piton and A. Natansohn, *Macromolecules*, 28, 1605, 1995).

A variety of test methods exist for evaluating the miscibility or compatibility of polymers, as reflected in the recent overview published in A. Hale and H. Bair, Ch. 4—"Polymer Blends and Block Copolymers," *Thermal Characterization of Polymeric Materials*, 2nd Ed., Academic Press, 1997. For example, in the realm of optical methods, opacity typically indicates a two-phase material, whereas clarity generally indicates a compatible system. Other methods for evaluating miscibility include neutron scattering, infrared spectroscopy (IR), nuclear magnetic resonance (NMR), x-ray scattering and diffraction, fluorescence, Brillouin scattering, melt titration, calorimetry, and chemilluminescence. See, for example, L. Robeson, supra; S. Krause, *Chemtracts—Macromol. Chem.*, 2, 367, 1991a; D. Vessely in *Polymer Blends and Alloys*, M. J. Folkes and P. S. Hope, Eds., Blackie Academic and Professional, Glasgow, pp. 103-125; M. M. Coleman et al. *Specific Interactions and the Miscibility of Polymer Blends*, Technomic Publishing, Lancaster, Pa., 1991; A. Garton, *Infrared Spectroscopy of Polymer Blends, Composites and Surfaces*, Hanser, New York, 1992; L. W. Kelts et al., *Macromolecules*, 26, 2941, 1993; and J. L. White and P. A. Mirau, *Macromolecules*, 26, 3049, 1993; J. L. White and P. A. Mirau, *Macromolecules*, 27, 1648, 1994; and C. A. Cruz et al., *Macromolecules*, 12, 726, 1979; and C. J. Landry et al., *Macromolecules*, 26, 35, 1993.

Compatibility has also been promoted in otherwise incompatible polymers by incorporating reactive groups into the polymer matrix, where such groups are capable of reacting with the photoactive monomer during the holographic recording step. Some of the photoactive monomer will thereby be grafted onto the matrix during recording. If there are enough of these grafts, it is possible to prevent or reduce phase separation during recording. However, if the refractive index of the grafted moiety and of the monomer is relatively similar, too many grafts, e.g., more than 30% of monomers grafted to the matrix, will tend to undesirably reduce refractive index contrast.

The invention will be further clarified by the following examples, which are intended to be exemplary. Precise and accurate mixing of the two components, free of entrapped air bubbles, is carried out by metering the liquid from both tanks simultaneously into dynamic mixer in an apparatus as shown in FIG. 1. To form a holographic recording article, the desired amount of the well-mixed precursor material is dispensed onto the clearance between substrates 1 and 2 as explained above.

High performance holographic recording articles are characterized by low shrinkage, dynamic range, and sensitivity. Low shrinkage will assure non-degradation of the recorded holograms and total fidelity of the holographic data to be recovered. Low shrinkage in the range of less than 0.2% is required. The dynamic range of a holographic recording medium is typically characterized by the parameter, M/#, a measure of how many holograms of a given average diffraction efficiency can be stored in a common volume. The M/# is determined by both the refractive index contrast and thickness of a medium. Typical values of M/# are 1.5 or better. The photosensitivity is characterized by the total exposure time required to consume the dynamic range of the media. The sensitivity can be in the range of 5 to 600 seconds.

Details of the measurements of the recording-induced shrinkage, M/#/200 μm, and sensitivity are described in detail in Applied Physics Letters, Volume 73, Number 10, p. 1337-1339, 7 Sep. 1998, which is incorporated herein by reference.

COMPARATIVE EXAMPLE

A Slow Cure Composition

This comparative example was prepared and evaluated in accordance with the procedures described above except using the following ingredients to illustrates the performance characteristics of a slow reaction precursor material.

| Component 1, Tank A | Baytech WE-180 | 415.7 gm |
|---|---|---|
|  | Tribromophenylacrylate | 38.0 gm |
|  | Irgacure-784 | 8.44 gm |
|  | BHT | 210 mg |
| Viscosity@25° C., cps | 850 | |
| Component 2, Tank B | Polypropylene Oxide Triol | 577 gm |
|  | t-Butylhydroperoxide | 310 μl |
|  | Dibutyltindilaurate | 10.2 gm |
| Viscosity@25° C., cps | 220 | |
| Fabricate the articles | | |
| Amount metered out of component 1, Tank A | | 10.0 gm |
| Amount metered out of component 2, Tank B | | 13.0 gm |
| Viscosity @25° C. of the mixture of liquids A & B | | 520 cps |
| Time taken to mix in the dynamic mixing chamber | | 15 min |
| Viscosity of the mixture when dispensed out of the chamber | | 780 cps |
| Time taken for the mixture to set | | 35 min. |
| Fabrication completed | | 3 hours |
| Shrinkage | | 0.1% |
| Dynamic range, M/#/200 μm | | 2.4 |
| Sensitivity, seconds to write 80% of the sample | | 25 |

Baytech WE-180, available from Bayer, is a 50/50 blend of biscyclohexylmethane diisocyanate and a NCO-terminated prepolymer based on biscyclohexylmethane diisocyanate and polytetramethylene glycol. Polypropylene Oxide Triol of 1000 molecular weight.

Example 1

High Viscosity and Fast Cure at Room Temperature

Samples of Example 1 were prepared and evaluated in accordance with the procedures of Comparative Example except using the following ingredients to illustrates the performance characteristics of a precursor material having fast cure at room temperature.

| | | |
|---|---|---|
| Liquid A, from Tank A | Desmodur N3200 | 100.00 gm |
| | Tribromophenylacrylate | 12.11 gm |
| | BHT | 168 mg |
| Viscosity@25° C., cps | 1350 | |
| Liquid B, from Tank B | K-FLEX XM-A307 | 221 gm |
| | t-Butylhydroperoxide | 310 µl |
| | Irgacure 784 | 2.522 gm |
| | Dibutyltindilaurate | 10.2 gm |
| Viscosity@25° C., cps | 5400 | |
| Fabricate the articles | | |
| Amount metered out of Liquid A, Tank A | | 7.47 gm |
| Amount metered out of Liquid B, Tank B | | 15.53 gm |
| Viscosity @25° C. of the mixture of liquids A & B | | 3750 |
| Time taken to mix in the dynamic mixing chamber | | 0.5 min |
| Viscosity of the mixture when dispensed out of the chamber | | 12,400 cps |
| Time taken for the mixture to begin setting up | | 3 min. |
| Fabrication completed | | 10 min. |
| Shrinkage | | 0.1% |
| Dynamic range, M/#/200 µm | | 2.24 |
| Sensitivity, seconds to write 80% of the sample | | 28 |

Desmodur N3200 is the biuret of hexamethylene diisocyanate available from Bayer. K-FLEX XM-A307 is a polyester polyol with a hydroxyl number of 140, available from King Industries.

Example 2

High Viscosity and Fast Cure, Applied at 40° C.

Samples of Example 2 were prepared and evaluated in accordance with the procedures of Comparative Example except using the following ingredients to illustrates the performance characteristics of a precursor material having fast cure at 40° C.

| | | |
|---|---|---|
| Liquid A, from Tank A | Desmodur N3200 | 80.00 gm |
| | Tribromophenylacrylate | 9.2 gm |
| | BHT | 162 mg |
| Viscosity@25° C., cps | 1350 | |
| Liquid B, from Tank B | Rucoflex S1028-210 | 118.01 gm |
| | Rucoflex S1021-70 | 88.4 gm |
| | t-Butylhydroperoxide | 1.94 gm |
| | Irgacure 784 | 2.522 gm |
| | Dibutyltindilaurate | 10.2 gm |
| Viscosity@60° C., cps | 780 | |
| Fabricate the articles | | |
| Amount metered out of Liquid A, Tank A | | 7.47 gm |
| Amount metered out of Liquid B, Tank B | | 15.53 gm |
| Viscosity @40° C. of the mixture of liquids A & B | | 8700 cps |
| Time taken to mix in the dynamic mixing chamber | | 12 sec |
| Viscosity of the mixture when dispensed out of the chamber | | 38,200 cps |
| Time taken for the mixture to begin setting up | | 1.5 min. |
| Fabrication completed | | 5 min. |
| Shrinkage | | 0.1% |
| Dynamic range, M/#/200 µm | | 2.35 |
| Sensitivity, seconds to write 80% of the sample | | 25 |

Rucoflex S1028-210 is a polyester diol with a hydroxyl number of 210 and available from Ruco Polymer Corp. Rucoflex S 1021-70 is a polyester diol with a hydroxyl number of 70 and available from Ruco Polymer Corp.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. This application discloses several numerical range limitations. The numerical ranges disclosed inherently support any range within the disclosed numerical ranges even though a precise range limitation is not stated verbatim in the specification because this invention can be practiced throughout the disclosed numerical ranges. The entire disclosure of the patents and publications referred in this application are hereby incorporated herein by reference.

What is claimed is:

1. A laminated holographic recording medium comprising (a) a first substrate having a through-hole (b) a solid polymer matrix layer that records holographic data laminated to the substrate, and (c) a second substrate, wherein the solid polymer matrix layer has a thickness in the range of about 300 micron to about 3,000 micron, is formed by polymerizing a precursor material that is mixed utilizing in-line dynamic mixing, injected through the through-hole and polymerized in contact with the first substrate and second substrate as a clearance between the first and second substrate is decreased, and wherein the solid polymer matrix layer produces substantially no optical distortion.

2. The laminated holographic recording medium of claim 1, wherein the solid polymer matrix layer has a variation in the thickness of no more than 10 percent.

3. The laminated holographic recording medium of claim 1, wherein the first substrate is disk-shaped and the through-hole is at the center of the first substrate.

4. The laminated holographic recording medium of claim 1, wherein the solid polymer matrix layer is substantially void-free.

5. The laminated holographic recording medium of claim 1, wherein the laminated holographic recording medium is disk-shaped or card-shaped.

6. A method of manufacturing a laminated holographic recording medium comprising (a) a first substrate having a through-hole (b) a solid polymer matrix layer that records holographic data laminated to the first substrate, and (c) a second substrate, the method comprising mixing a precursor material utilizing an in-line dynamic mixer, injecting the precursor material between the first substrate the second substrate through the through-hole and polymerizing the precursor material in contact with the first substrate to form the polymer matrix layer, wherein a clearance between the first and second substrate is decreased during polymerization of the precursor material, and wherein the solid polymer matrix layer produces substantially no optical distortion.

7. The method of claim 6, further comprising mixing the precursor material in a mixer prior to the injecting the precursor material through the through-hole.

8. The method of claim 7, wherein the first substrate is disk-shaped and the through-hole is at the center of the first substrate.

9. The method of claim 6, further comprising applying pressure on the precursor material during the formation of the solid polymer matrix layer.

10. The method of claim 6, wherein the laminated holographic recording medium is disk-shaped or card-shaped.

11. The method of claim 6, wherein the precursor material comprising (a) chemical constituents that react by a first reaction to form a solid polymer matrix in less than 20 minutes at room temperature or less than 15 minutes at 40° C. after mixing the chemical constituents at room temperature, and (b) a monomer and a photoinitiator, wherein the monomer and the photoinitiator react by a second reaction that is different from the first reaction.

12. The method of claim 11, wherein shrinkage of the precursor material during the formation of the solid polymer matrix is less than about 0.12%.

13. The method of claim 11, wherein the monomer and the photoinitiator react by the second reaction to form a photopolymer.

14. The method of claim 11, wherein the chemical constituents comprise an epoxy resin and an aliphatic amine.

15. The method of claim 11, wherein the chemical constituents comprise an isocyanate and a polyol.

16. The method of claim 11, wherein the monomer comprises an acrylate.

\* \* \* \* \*